(12) United States Patent
Lee, Jr. et al.

(10) Patent No.: US 7,106,044 B1
(45) Date of Patent: Sep. 12, 2006

(54) SYSTEMS, METHODS, AND APPARATUSES FOR DETECTING RESIDENTIAL ELECTRICITY THEFT IN FIRMWARE

(75) Inventors: Robert E. Lee, Jr., Dover, NH (US); Leslie Rosenau, Dover, NH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/161,412

(22) Filed: Aug. 2, 2005

(51) Int. Cl.
   *G08B 23/00* (2006.01)
(52) U.S. Cl. ...................... 324/110; 324/142
(58) Field of Classification Search .......... 324/99 D, 324/142, 110; 340/870.02, 870.11; 702/60–62; 379/106.01, 106.03
   See application file for complete search history.

(56) References Cited

U.S. PATENT DOCUMENTS

| 6,232,886 B1 * | 5/2001 | Morand ................. 340/870.02 |
| 6,236,197 B1 * | 5/2001 | Holdsclaw et al. ......... 324/110 |

\* cited by examiner

*Primary Examiner*—Vinh P. Nguyen
(74) *Attorney, Agent, or Firm*—Sutherland Asbill & Brennan LLP (57) ABSTRACT

Systems, methods, and apparatuses are disclosed for electricity meters to detect electricity theft. An indication of electricity theft may be generated if after an occurrence of a first power outage, the meter detects received energy and if after the occurrence of a subsequent power outage, the meter detects delivered energy. The utility company may then be alerted to the indication of the electricity theft.

20 Claims, 5 Drawing Sheets

SYSTEMS, METHODS, AND APPARATUSES FOR DETECTING RESIDENTIAL ELECTRICITY THEFT IN FIRMWARE

BACKGROUND OF THE INVENTION

1. Field of the Invention

Aspects of the present invention relate generally to electricity meters and more particularly, to systems, methods, and apparatuses for detecting electricity theft in electricity meter software and/or hardware, including firmware.

2. Description of the Related Art

Some residential electro-mechanical electricity meters may run backwards when inverted in the meter socket. These electricity meters may include 3-wire, two phase residential service meters using a Form 2S, which is symmetrical and can be inverted. Some unscrupulous customers may tamper with these meters in order to reduce the accumulated energy on the meters, thereby reducing their electricity bills. Such residential electricity theft results in significant lost revenue for utility companies.

Other electricity meters have used a tilt switch to detect when a meter is removed from the socket. In addition, others have been provided with a detent to prevent the meter from running backwards. Still other meters may have additional hardware and/or software to accumulate both received and delivered energy. However, none of these meters have the ability to detect and alert a utility company to electricity theft.

Accordingly, there is a need in the industry for systems and methods of detecting and alerting utility companies of such potential electricity theft through meter software and/or hardware, including firmware.

BRIEF DESCRIPTION OF THE INVENTION

In accordance with embodiments of the present invention, solid-state electricity meter software and/or hardware or a combination thereof (e.g., firmware or executable instructions, generally) may monitor energy usage patterns for potential electricity theft without the need for external hardware. According to an aspect of the invention, the utility company may be alerted of the potential electricity theft.

According to an embodiment of the invention, there is disclosed a method of detecting electricity theft in an electricity meter. The method includes after an occurrence of a first power outage, determining if the meter detects received energy, after the occurrence of a subsequent power outage, determining if the meter detects delivered energy, and if received energy is detected after the first power outage and if delivered energy is detected after the second power outage, then generating an indication of electricity theft.

According to an aspect of the invention, detecting received energy includes analyzing energy flow information collected within the meter. According to another aspect of the invention, detecting delivered energy includes analyzing energy flow information collected within the meter. According to another aspect of the invention, the method further includes displaying the indication of electricity theft on a display of the meter. According to yet another aspect of the invention, the method further includes communicating the indication of electricity theft to an automatic meter reading system. According to another aspect of the invention, detecting received energy includes detecting received energy by the meter for a predetermined amount of time. According to another aspect of the invention, detecting received energy includes detecting a predetermined amount of received energy by the meter.

According to another embodiment of the invention, there is disclosed an electricity meter apparatus configured to be coupled to a socket. The apparatus includes one or more sensors for detecting received energy and delivered energy, means for detecting power outages, means for determining if the meter detects received energy after the occurrence of a first power outage, means for determining if the meter detects delivered energy after the occurrence of a subsequent second power outage, and means for generating an indication of electricity theft if the meter detects received energy after the occurrence of the first power outage and detects delivered energy after the occurrence of the subsequent second power outage.

According to an aspect of the invention, the meter further includes a display suitable for displaying the indication of electricity theft. According to another aspect of the invention, the means for detecting power outages include at least one sensor for detecting use of battery power by the meter. According to yet another aspect of the invention, the meter further includes a communications module operable for transmitting the indication of electricity theft. The communications module may be operable for transmitting the indication of electricity theft to an automatic meter reading system. According to another aspect of the invention, the one or more sensors may include a metering chip.

According to yet another embodiment of the invention, there is disclosed an electricity distribution system. The system includes a plurality of customer lines for receiving electricity from a utility company, at least one electricity meter coupled to each customer line, where each electricity meter includes a processor for executing instructions, one or more sensors in communication with the processor for detecting received energy and delivered energy, means for detecting power outages, and a memory coupled to the processor, where the memory includes executable instructions for after an occurrence of a first power outage, determining if the electricity meter detects received energy and after the occurrence of a subsequent power outage, determining if the electricity meter detects delivered energy. The electricity meter further includes means for generating an indication of electricity theft if the meter detects received energy after the occurrence of the first power outage and detects delivered energy after the occurrence of the subsequent second power outage. The system further includes a communications system that establishes communication between the electricity meter and the utility company.

According to an aspect of the invention, the means for generating an indication of electricity theft may include means for setting a theft alert flag in memory. According to another aspect of the invention, the means for generating an indication of electricity theft may include means for setting a latch associated with the meter. According to yet another aspect of the invention, the electricity meter further includes a display for displaying the indication of electricity theft. According to another aspect of the invention, the electricity meter further includes a communications module for transmitting the indication of electricity theft to the communications system. The communications system may be an automatic meter reading system. According to another aspect of the invention, the one or more sensors may include a metering chip.

BRIEF DESCRIPTION OF THE DRAWINGS

Having thus described aspects of the invention in general terms, reference will now be made to the accompanying drawings, which are not necessarily drawn to scale, and wherein:

DETAILED DESCRIPTION OF THE INVENTION

The present invention is described below with reference to figures and flowchart illustrations of systems, methods, apparatuses and computer program products according to an embodiment of the invention. It will be understood that each block of the flowchart illustrations, and combinations of blocks in the flowchart illustrations, respectively, may be implemented by computer program instructions. These computer program instructions may be loaded onto a general purpose computer, special purpose computer, or other programmable data processing apparatus to produce a machine, such that the instructions which execute on the computer or other programmable data processing apparatus create means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including instruction means that implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions. The inventions may be implemented through an application program running on an operating system of a computer. The inventions also may be practiced with other computer system configurations, including hand-held devices, multiprocessor systems, microprocessor based or programmable consumer electronics, mini-computers, mainframe computers, etc.

Application programs that are components of the invention may include routines, programs, components, data structures, etc. that implements certain abstract data types, perform certain tasks, actions, or tasks. In a distributed computing environment, the application program (in whole or in part) may be located in local memory, or in other storage. In addition, or in the alternative, the application program (in whole or in part) may be located in remote memory or in storage to allow for the practice of the inventions where tasks are performed by remote processing devices linked through a communications network.

The present invention will now be described more fully hereinafter with reference to the accompanying figures, in which like numerals indicate like elements throughout the several drawings. Some, but not all embodiments of the invention are described. Indeed, these inventions may be embodied in many different forms and should not be construed as limited to the embodiments set forth herein; rather, these embodiments are provided so that this disclosure will satisfy applicable legal requirements, be thorough and complete, and will fully convey the scope of the invention to those skilled in the art.

Figure 1:
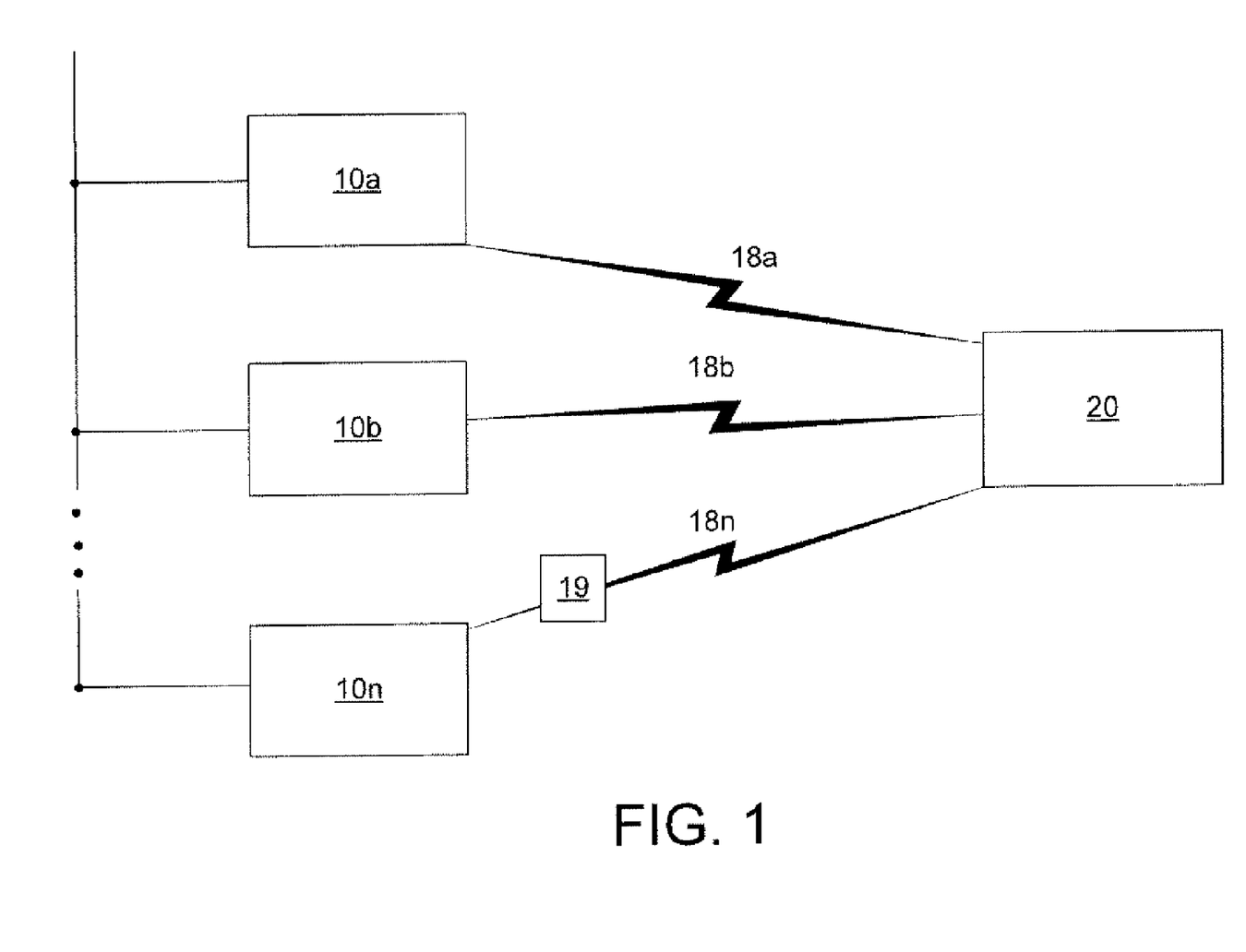
FIG. 1 illustrates an exemplary system overview diagram according to an embodiment of the present invention.

FIG. 1 illustrates an exemplary system overview diagram according to an embodiment of the present invention. Referring to FIG. 1, an electricity meter $10a$ . . . $10n$, may be provided to each of a plurality of customer lines from which electricity may be received from a utility company 20. The meters $10a$ . . . $10n$ may monitor and store electricity usage and/or demand information for the plurality of customer lines. The meters may further monitor and record status information for the plurality of customer lines. The utility company 20 may interact with the meters $10a$ . . . $10n$ through respective signal paths $18a$, $18b$, . . . $18n$ of a communications system to retrieve information from the meters. A variety of methods, both wired and wireless, may be utilized for the signal paths $18a$ . . . $18n$ of the communications system according to an embodiment of the present invention. For example, the electricity meters $10a$ . . . $10n$ may communicate through a telephone line, an automatic meter reading system 19, an optical port, an RS-232 line, wireless systems, and many other means of communications. In addition, receiving devices, such as hand-held devices may communicate with the electricity meters $10a$ . . . $10n$. The receiving devices may then subsequently communicate any collected information to the utility company 20. The receiving devices may include cellular devices such as phones, PDAs, notebook computers, specialized receivers, or handheld devices. The receiving devices or aspects thereof may also be incorporated with mobile vehicles, including those utilized with automatic meter reading systems 19. The mobile vehicles may include vans, cars, ATVs, motorcycles, segways, planes, remote control planes, and a variety of other transportation vehicles. According to an illustrative embodiment, a drive-by vehicle such as a van may be utilized with an automatic meter reading system 19. According to another embodiment, a receiving device may be utilized by personnel visiting one or more electricity meters $10a$ . . . $10n$. According to another embodiment, the utility company 20 may communicate with the electricity meters $10a$ . . . $10n$ remotely through a telephone line. Many other variations are well-known to one of ordinary skill in the art.

Figure 2:
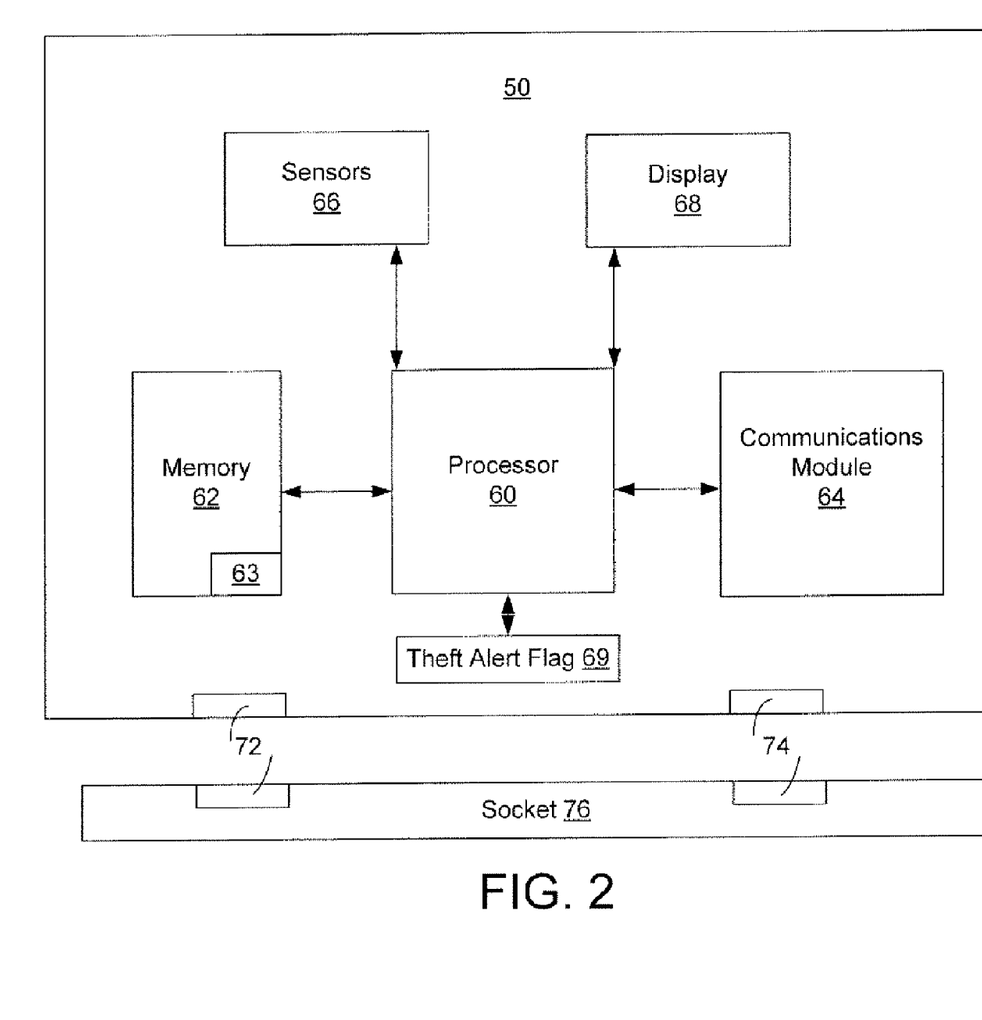
FIG. 2 illustrates an exemplary block diagram of an electricity meter according to an embodiment of the present invention.

FIG. 2 illustrates an exemplary electricity meter 50 according to an embodiment of the present invention. The meter 50 may be coupled to an alternating current (AC) power source provided by the utility company. The meter 50 includes a processor 60, a memory 62, a communications module 64, one or more sensors 66, and a display 68. According to one embodiment, processor 60 may be a microprocessor with read-only memory (ROM) and/or random access memory (RAM). For example, processor 60 may be a 32 bit microcomputer with 2 Mbit ROM, 64 Kbit RAM. The processor 60 may also be in communications with a real-time clock (not shown), which may be a discrete component or implemented in software stored in the memory 62. The memory 62 may include a variety of storage methods, including flash memory, electronically erasable programmable memory, read only memory (ROM), removable media, and other volatile and non-volatile storage devices as are understood by one of ordinary skill in the art. One of ordinary skill in the art will appreciate that the memory 62 may include a plurality of memories and memory modules.

Still referring to FIG. 2, the processor 60 may execute instructions 63 (e.g., software instructions) stored in the memory 62 and may also store data in the memory 62. The communications module 64 may be utilized for transmitting information to and perhaps for receiving information from the utility company. For example, the communications module 64 may include one or more of optical ports for communicating with an external reader, a telephone modem, an RS-232 line, a simple input/output (I/O) board, a complex I/O board, and a plurality of wireless and cellular technologies as understood by one of ordinary skill in the art. In addition, the communications module 64 may communicate with an automatic meter reading system, which may include a drive-by vehicle for communicating with the meter 50. The sensors 66 may include current and voltage sensors and may generate measurements of current and voltage. Further the sensors 66 may include or be in communication with analog-to-digital converters and/or digital signal processors. The display 68 may be utilized to display a plurality of information associated with the meter, including electricity usage and demand along with status alerts. The display 68 may be of virtually any display technology, including LCD, plasma, CRT, and analog-type displays. A theft alert flag 69 may also be included, which may be implemented with additional hardware mechanism (e.g., a physical latch), in memory 62 and/or associated software, or perhaps on display 68. In addition, although not shown, the meter 50 may include a power source such as a battery. Implementations of meters 50 in accordance with embodiments of the present invention may be include other components as desired for the operation of a meter, such as are generally described in U.S. Pat. No. 6,778,920.

Still referring to FIG. 2, the meter 50 may be in communication with a socket 76. The meter 50 may include a line connection 72 and a load connection 74. Similarly, the socket 76 may include a corresponding line connection 72 and the load connection 74. While the line connection 72 and the load connection 74 are illustrated in FIG. 2 as a single terminal or wire, it will be understood that the line connection 72 and the load connection 74 may have a plurality of terminals or wires. In a normal operation of the meter 50, the line connection 72 of the meter 50 couples to the line connection 72 of the socket 76. Similarly, in a normal operation of the meter, the load connection 74 of the meter 50 couples to the load connection of the socket 76.

Embodiments of the present invention may be implemented in electricity meter software, hardware, or a combination thereof (e.g., firmware, which may include memory 62, or executable instructions 63, generally) for detecting patterns associated with electricity theft. According to one embodiment of the present invention, this software, hardware, or a combination thereof (e.g., firmware, which may include memory 62, or executable instructions 63, generally) for detecting such patterns may be implemented in a solid state electricity meter 50 with automatic meter reading (see, e.g., automatic meter reading system 19 of FIG. 1). Alternative embodiments may implement this software, hardware, or a combination thereof (e.g., firmware, which may include memory 62, or executable instructions 63, generally) in solid state electricity meters 50 without automatic meter reading.

Figure 3:
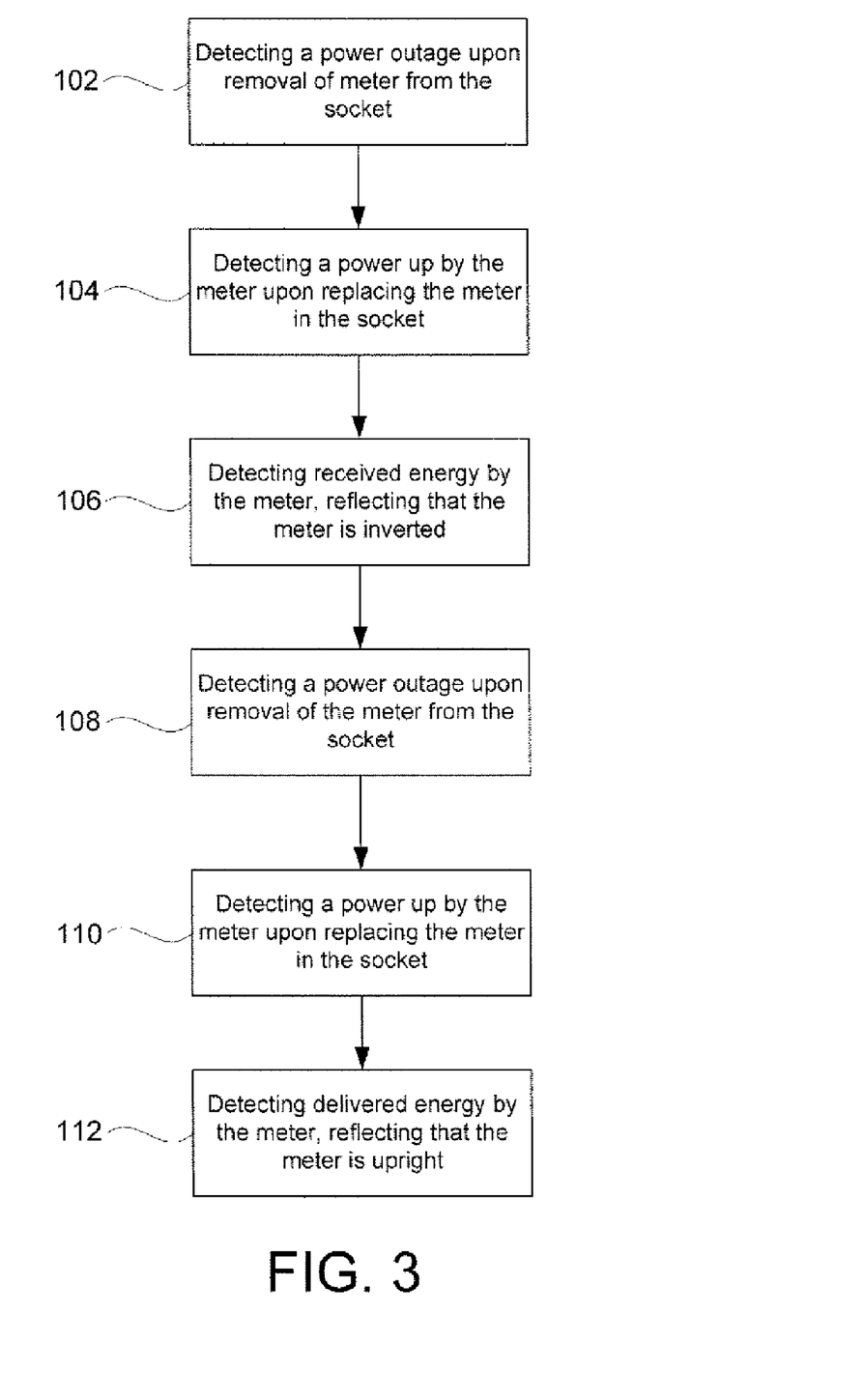
FIG. 3 provides an illustrative operation of the electricity meter in accordance with an embodiment of the invention, in response to the described pattern.

A pattern that may be detected by the operation of electricity meter 50 in accordance with an embodiment of the present invention is now described. FIG. 3 provides an operation of the meter 50 in accordance with an embodiment of the invention, in response to the described pattern. Initially, a meter 50 may detect a power outage when the meter 50 is removed from its socket 76 (block 102). During such a power outage, the meter 50 may include a sensor for detecting either the loss of power and/or the subsequent change to battery power. The meter is then altered (e.g., inverted) from a first position to a second position by swapping the line 72 and load 74 connections between the meter and its socket. According to one embodiment, this may entail physically rotating the meter 50 in its socket 76. According to another embodiment, either the line and load connections in either the socket 76 or meter 50 may be rewired such that the line connection 72 of the meter 50 couples to the load connection 74 of the socket 76 while the load connection 74 of the meter 50 couples to the line connection 72 of the socket 76. Once the altered (e.g., inverted) meter 50 is replaced in the socket 76, a power up or restoration of power may be detected by the meter 50 (block 104). Because the meter 50 is now in an altered (e.g., inverted), the meter 50 may detect received energy (load to line) (block 106). The unscrupulous customer would allow the altered (e.g. inverted) meter 50 to run backwards long enough to reduce the electricity bill (e.g., through received energy (load to line) time, thereby reducing kWh, accumulated energy). The meter 50 is then removed from the socket 76, thereby resulting in a detected power outage (block 108). The meter 50 is then restored back to an unaltered state (e.g., non-inverted or upright) such that the line 72 and load 72 connections of the meter 50 and socket 76 are coupled to each other. Thus, when the unaltered meter 50 is replaced in the socket 76, a power up or power restoration is detected by the meter 50 (block 110). Because the meter 50 is now unaltered (e.g., non-inverted or upright), the meter 50 may detect delivered energy (line to load) (block 112). Accordingly, when the utility company reads the meter 50 for billing purposes, the delivered energy time (line to load), kWh, and/or accumulated energy may be significantly less for the billing period than had the meter 50 not been altered.

According to an aspect of the present invention, sensors 66 and other off the shelf metering chips may be used to provide the energy flow information. The energy flow information may include delivered and/or received energy. For example, metering chips such as the AMD 7759 may be utilized to provide the energy flow information in accordance with embodiments of the present invention. The metering chip may be utilized for implemented a sensor 66 in meter 50.

Figure 4:
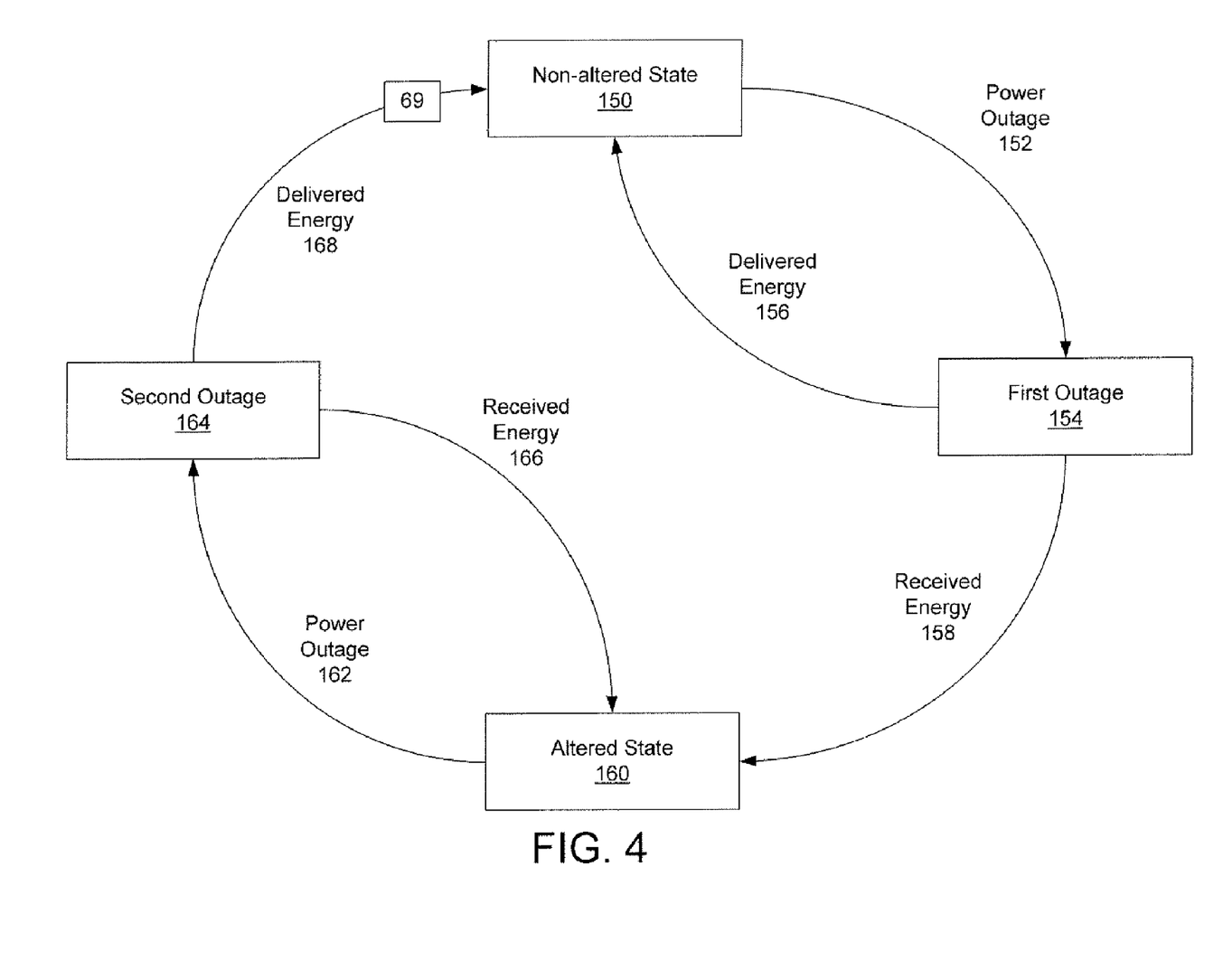
FIG. 4 illustrates an exemplary state diagram for an electricity meter according to an embodiment of the present invention.

FIG. 4 illustrates an exemplary state diagram for a meter 50, according to an embodiment of the invention. Referring to FIG. 4, during normal operation, the meter 50 is in an unaltered (e.g., upright) state 150. For a variety of reasons, the meter 50 may experience a power outage 152, and therefore a first outage 152 may be detected. If the meter 50 is still in an unaltered (e.g., upright) state 150, then the meter 50 will continue to experience delivered energy 156. On the other hand, if the meter 50 has been altered (e.g., inverted), then the meter 50 is in an altered state 160 and may experience received energy 158. Again, for a variety of reasons, the meter 50 may experience a power outage 162, and therefore a second outage 164 may be detected. If the meter 50 is still in an altered (e.g., inverted) state 160, then the meter 50 may continue to experience received energy 166. However, if the meter 50 has been restored back to its unaltered (e.g., upright) state 150, then the meter 50 may experience delivered energy 168. In this situation, upon completion of the above states, theft alert flag 69 or other indication of electricity theft (e.g., a latch, display) may be set to indicate that electricity theft has been detected by meter 50.

Figure 5:
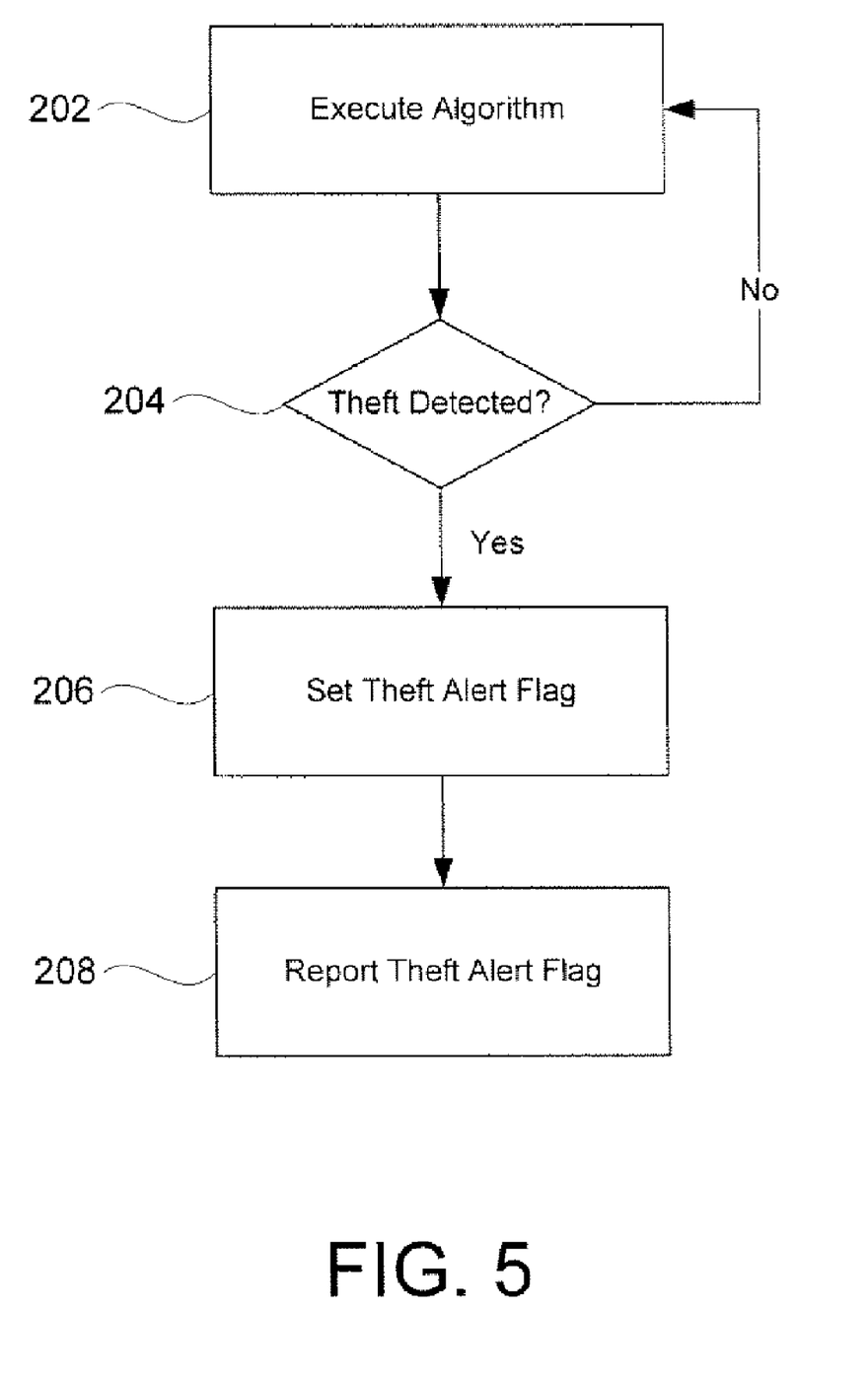
FIG. 5 illustrates an exemplary flow diagram for detecting electricity theft, according to an embodiment of the present invention.

Referring to FIG. 5, the algorithms described above in accordance with embodiments of the invention may be implemented in the electricity meter 50 such as through software, hardware, or a combination thereof (e.g., firmware or executable instructions, generally) (block 202). For example, the algorithm may be implemented in firmware, which may include memory 62. If the algorithm detects a potential theft (block 204), then an internal theft alert flag 69 or other indication of theft may be set (block 206). The theft alert flag 69 or other indication of theft may then reported to the utility company (block 208). The manner of reporting the theft alert flag 69 may take a variety of forms. For instance, the display 68 of the meter 50 may contain an indication of the potential theft. Thus, a meter reader dispatched by the utility company can then take note of such potential theft. According to another embodiment, the theft alert flag may be read locally or remotely through the communications module 64 through standard reading protocols such as PSEM (Protocol Specification for Electric Metering). According to yet another embodiment, the theft alert flag 69 may be read and/or broadcast by the communications module 64 for automatic meter reading (e.g., Itron ERT utilized with automatic meter reading system 19). One of ordinary skill in the art will recognize that one or more of the above-described methods of alerting a utility company to the potential electricity theft may be practiced with meter 50 in accordance with embodiments of the present invention.

One of ordinary skill in the art will recognize the theft alert flag 69 discussed above can be implemented in a variety of ways in accordance with embodiments of the invention. According to an embodiment, the theft alert flag 69 may be set in memory 62, displayed on display 68, and/or latched until cleared by the utility company providing a positive acknowledgment to the meter 50. For example, the theft alert flag may be a latching condition (either mechanically and/or in memory 62 or display 68) that must be acknowledged and cleared by the utility company interacting with the meter. The utility company may have to break the meter seal or use a secure communication in order to clear the theft alert flag. According to another embodiment, the meter may contain a memory 62 with a queue (e.g., a circular queue) containing enough daily records for a billing period. Each record in the queue may be utilized for storing detected conditions for that particular time period (e.g., day), including potential electricity thefts. Thus, each potential electricity theft detected by the algorithm may be recorded an entry in the queue. The potential electricity thefts may then be reported to an AMR system 19.

According to an aspect of the invention, the parameters of the algorithms, such as the minimum time, kWh, or accumulated energy in a state (e.g., an inverted state), may be configurable to minimize false theft alerts. According to another aspect of the invention, the algorithm may monitor the data for more than one billing period, looking for multiple instances of a theft pattern in order to reduce false theft alerts. According to yet another aspect of the invention, false theft alerts may not be triggered by common electric distribution grid disturbances, such as a reclosure switch clearing a line fault, and the power temporarily or intermittently runs delivered.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method of detecting electricity theft in an electricity meter, comprising:
   after an occurrence of a first power outage, determining if the meter detects received energy;
   after the occurrence of a subsequent second power outage, determining if the meter detects delivered energy; and
   if received energy is detected after the first power outage and if delivered energy is detected after the second power outage, then generating an indication of electricity theft.

2. The method of claim 1, wherein detecting received energy comprises analyzing energy flow information collected within the meter.

3. The method of claim 1, wherein detecting delivered energy comprises analyzing energy flow information collected within the meter.

4. The method of claim 3, further comprising displaying the indication of electricity theft on a display of the meter.

5. The method of claim 3, further comprising communicating the indication of electricity theft to an automatic meter reading system.

6. The method of claim 1, wherein detecting received energy comprises detecting received energy by the meter for a predetermined amount of time.

7. The method of claim 1, wherein detecting received energy comprises detecting a predetermined amount of received energy by the meter.

8. An electricity meter apparatus configured to be coupled to a socket, comprising:
   one or more sensors for detecting received energy and delivered energy;
   means for detecting power outages;
   means for determining if the meter detects received energy after the occurrence of a first power outage;
   means for determining if the meter detects delivered energy after the occurrence of a subsequent second power outage; and
   means for generating an indication of electricity theft if the meter detects received energy after the occurrence of the first power outage and detects delivered energy after the occurrence of the subsequent second power outage.

9. The electricity meter apparatus of claim 8, wherein the meter further comprises a display suitable for displaying the indication of electricity theft.

10. The electricity meter apparatus of claim 8, wherein the means for detecting power outages comprise at least one sensor for detecting use of battery power by the meter.

11. The electricity meter apparatus of claim 8, wherein the meter further comprises a communications module operable for transmitting the indication of electricity theft.

12. The electricity meter apparatus of claim 8, wherein the communications module is operable for transmitting the indication of electricity theft to an automatic meter reading system.

13. The electricity meter apparatus of claim 8, wherein the one or more sensors comprise a metering chip.

14. An electricity distribution system, comprising:
   a plurality of customer lines for receiving electricity from a utility company;
   at least one electricity meter coupled to each customer line, wherein each electricity meter comprises:
      a processor for executing instructions;
      one or more sensors in communication with the processor for detecting received energy and delivered energy;
      means for detecting power outages;
      a memory coupled to the processor, wherein the memory comprises executable instructions for:
         after an occurrence of a first power outage, determining if the electricity meter detects received energy;
         after the occurrence of a subsequent second power outage, determining if the electricity meter detects delivered energy; and
      means for generating an indication of electricity theft if the meter detects received energy after the occurrence of the first power outage and detects delivered energy after the occurrence of the subsequent second power outage; and
   a communications system that establishes communication between the electricity meter and the utility company.

15. The system of claim 14, wherein the means for generating an indication of electricity theft comprises means for setting a theft alert flag in memory.

16. The system of claim 14, wherein the means for generating an indication of electricity theft comprises means for setting a latch associated with the meter.

17. The system of claim 14, wherein the electricity meter further comprises a display for displaying the indication of electricity theft.

18. The system of claim 14, wherein the electricity meter further comprises a communications module for transmitting the indication of electricity theft to the communications system.

19. The system of claim 14, wherein the communications system comprises an automatic meter reading system.

20. The system of claim 14, wherein the one or more sensors comprise a metering chip.

* * * * *